US012595557B2

(12) United States Patent
Mousa et al.

(10) Patent No.: US 12,595,557 B2
(45) Date of Patent: Apr. 7, 2026

(54) METHOD OF FORMING STRUCTURE INCLUDING A DOPED ADHESION FILM

(71) Applicant: ASM IP Holding B.V., Almere (NL)

(72) Inventors: Moataz Bellah Mousa, Chandler, AZ (US); Jiyeon Kim, Mesa, AZ (US); Jaebeom Lee, Tempe, AZ (US); Charith Eranga Nanayakkara, Tempe, AZ (US); Paul Ma, Scottsdale, AZ (US); Chuandao Wang, Phoenix, AZ (US); Youngchol Byun, Tempe, AZ (US); Jacqueline Wrench, Mesa, AZ (US); Guannan Chen, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 92 days.

(21) Appl. No.: 18/141,694

(22) Filed: May 1, 2023

(65) Prior Publication Data

US 2023/0349040 A1     Nov. 2, 2023

Related U.S. Application Data

(60) Provisional application No. 63/337,312, filed on May 2, 2022.

(51) Int. Cl.
| | |
|---|---|
| *C23C 16/22* | (2006.01) |
| *C23C 16/04* | (2006.01) |
| *C23C 16/06* | (2006.01) |
| *C23C 16/455* | (2006.01) |

(52) U.S. Cl.
CPC ............ *C23C 16/22* (2013.01); *C23C 16/045* (2013.01); *C23C 16/06* (2013.01); *C23C 16/45525* (2013.01)

(58) Field of Classification Search
CPC ....... C23C 16/22; C23C 16/045; C23C 16/06; C23C 16/45525
See application file for complete search history.

(56) References Cited

U.S. PATENT DOCUMENTS

| | | | |
|---|---|---|---|
| 6,177,338 B1 | 1/2001 | Liaw | |
| 6,211,016 B1 | 4/2001 | Wu | |
| 6,436,825 B1 | 8/2002 | Shue | |
| 7,030,431 B2 | 4/2006 | Lin | |
| 7,067,416 B2 | 6/2006 | Derraa | |
| 7,071,052 B2 | 7/2006 | Yeo | |
| 7,294,581 B2 | 11/2007 | Iyer | |
| 7,416,995 B2 | 8/2008 | Iyer | |
| 7,563,715 B2 | 7/2009 | Haukka | |
| 7,867,900 B2 | 1/2011 | Lee | |
| 8,927,403 B2 | 1/2015 | Huotari | |
| 10,879,177 B2 | 12/2020 | Yu | |

(Continued)

*Primary Examiner* — Austin Murata
(74) *Attorney, Agent, or Firm* — Snell & Wilmer L.L.P.

(57) ABSTRACT

A method and system for forming a structure are disclosed. An exemplary method includes providing a substrate comprising a plurality of gaps within a first reaction chamber, forming a doped adhesion film on the surface of a substrate and within the plurality of gaps, wherein the doped adhesion film comprises a first material and a second material, and depositing a metal overlying the doped adhesion film. Exemplary methods can further include a step of depositing a nucleation layer overlying the doped adhesion film. An exemplary system can perform the method of forming the structure.

20 Claims, 13 Drawing Sheets

(56) References Cited

U.S. PATENT DOCUMENTS

| | | | | |
|---|---|---|---|---|
| 11,270,911 B2 | 3/2022 | Chen | | |
| 11,295,980 B2 | 4/2022 | Zope | | |
| 11,410,881 B2 | 8/2022 | Li | | |
| 2005/0035410 A1 | 2/2005 | Yeo | | |
| 2006/0019495 A1 | 1/2006 | Marcadal | | |
| 2009/0297696 A1 | 12/2009 | Pore | | |
| 2013/0109172 A1 | 5/2013 | Collins | | |
| 2016/0133563 A1* | 5/2016 | Ai | H01L 21/76826 | |
| | | | | 438/628 |
| 2019/0067094 A1* | 2/2019 | Zope | C23C 16/0272 | |
| 2019/0385908 A1* | 12/2019 | Xie | H01L 21/2855 | |
| 2020/0144056 A1 | 5/2020 | Lei | | |
| 2021/0351072 A1* | 11/2021 | Chen | H01L 21/28556 | |
| 2022/0109066 A1 | 4/2022 | Niimi | | |
| 2022/0195598 A1* | 6/2022 | Collins | C23C 16/56 | |
| 2022/0359532 A1* | 11/2022 | Yang | C23C 16/34 | |
| 2022/0375792 A1* | 11/2022 | Schloss | H01L 21/76876 | |
| 2023/0015781 A1 | 1/2023 | Someshwar | | |

* cited by examiner

100

102
PROVIDE A SUBSTRATE

104
FORM A DOPED NITRIDE ADHESION FILM ON THE SURFACE OF THE SUBSTRATE

108
DEPOSIT A METAL OVERLYING THE DOPED NITRIDE ADHESION FILM

110
ETCH THE METAL OVERLYING THE DOPED NITRIDE ADHESION FILM

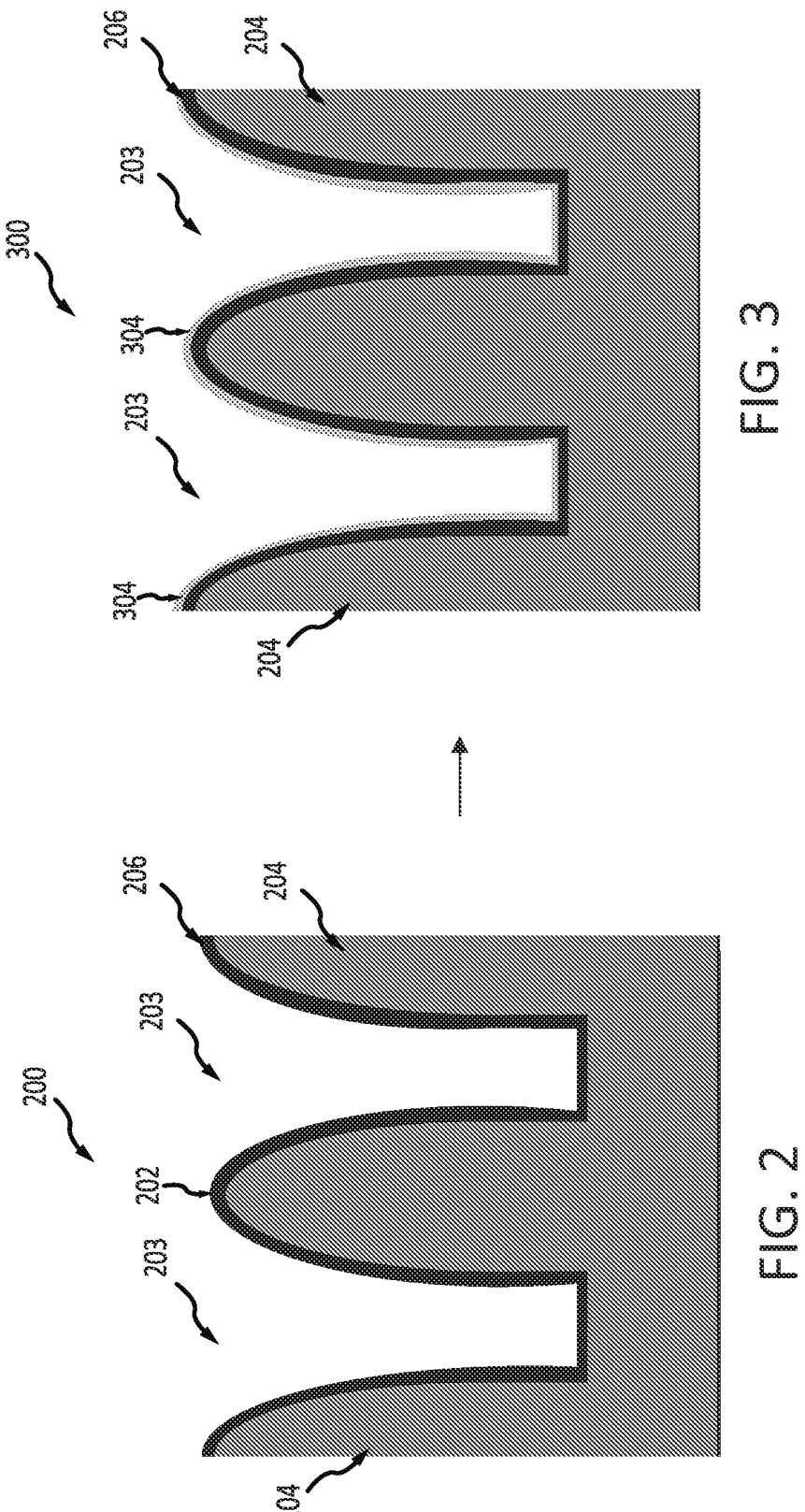

1200

1214 — DEPOSIT A LAYER OF THE FIRST MATERIAL OVERLYING THE SUBSTRATE

1224 — DEPOSIT A LAYER OF THE SECOND MATERIAL OVERLYING THE LAYER OF THE FIRST MATERIAL

1234 — DEPOSITING A SECOND LAYER OF THE FIRST MATERIAL OVERLYING THE LAYER OF THE SECOND MATERIAL

METHOD OF FORMING STRUCTURE INCLUDING A DOPED ADHESION FILM

CROSS-REFERENCE TO RELATED APPLICATIONS

This application is a nonprovisional of, and claims priority to and the benefit of, U.S. Provisional Patent Application No. 63/337,312, filed on May 2, 2022 and entitled "METHOD OF FORMING STRUCTURE INCLUDING A DOPED NITRIDE ADHESION FILM," the disclosure of which is hereby incorporated by reference herein.

FIELD OF INVENTION

The present disclosure generally relates to methods and systems used in the formation of electronic devices. More particularly, the disclosure relates to methods and systems suitable for at least partially filling gaps on a surface of a substrate during the manufacture of electronic devices.

BACKGROUND OF THE DISCLOSURE

Gas-phase reactors, such as chemical vapor deposition (CVD) reactors and the like, can be used for a variety of applications, including depositing and etching materials on a substrate surface, and cleaning of a surface of the substrate. For example, gas-phase reactors can be used to deposit layers on a substrate to form devices, such as semiconductor devices, flat panel display devices, photovoltaic devices, microelectromechanical systems (MEMS), and the like.

In many applications, it may be desirable to deposit one or more materials within gaps on a surface of the substrate. While some techniques have been developed to provide material within gaps, such methods may result in agglomeration and cluster formation of said material. Such agglomeration can lead to undesired void formation within the gap. In the case of conductive materials, the agglomeration can also lead to increased film resistivity. Additionally, pull-up/delamination of material from the surface of the substrate can result from high temperature process conditions. Accordingly, improved methods and systems for providing desired material within a gap, while mitigating agglomeration and cluster formation and reducing pull-up/delamination of the material are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods and systems for providing material within a gap—e.g., at least partially filling the gap with desired material. Additionally, various embodiments of the disclosure relate to a structure—e.g., formed by exemplary methods and/or to systems—e.g., to perform a method and/or to form a structure as described herein. As set forth in more detail below, exemplary methods include forming an adhesion film prior to filling a gap with (e.g., metal) material.

In accordance with various embodiments of the disclosure, a method of forming a structure is provided. Exemplary methods include providing a substrate comprising a plurality of gaps within a first reaction chamber, forming a doped adhesion film, such as a doped metal and/or nitride adhesion film, on the surface of the substrate and within the plurality of gaps wherein the doped nitride adhesion film comprises a first material and a second material, and depositing a metal overlying the doped nitride adhesion film. The metal can comprise a transition metal, such as at least one of molybdenum and ruthenium.

In accordance with examples of embodiments, the method of forming a structure can further comprise forming a nucleation layer overlying the doped nitride adhesion film. The nucleation layer can comprise, for example, at least one of the metal and a nitride.

In accordance with additional examples, the first material can be represented by $M_nX_m$ where M is the metal, X is a dopant, n ranges from 1 to 5, and m ranges from 1 to 10. The dopant can be or include, for example, one or more of titanium, tungsten, silicon, boron, nitrogen, carbon, tantalum, and manganese.

The second material can be or include, for example, one or more of titanium nitride, molybdenum, molybdenum silicide and titanium silicide. In accordance with examples of embodiments, the step of forming the doped nitride adhesion film can comprise forming the doped nitride adhesion film to a first thickness and the step of forming the nucleation layer can comprise forming the nucleation layer to a second thickness. The first thickness can be between 3 angstroms and 50 angstroms, between 15 angstroms and 50 angstroms, or between 3 angstroms and 10 angstroms and the second thickness can be between 1 angstrom and 10 angstroms.

In accordance with examples of embodiments, the step of forming the doped nitride adhesion film can comprise depositing a layer of the second material overlying the substrate and depositing a layer of the first material overlying the layer of the second material.

In accordance with examples of embodiments, the step of forming the doped nitride adhesion film can comprise depositing a layer of the first material overlying the substrate, depositing a layer of the second material overlying the layer of the first material, and depositing a second layer of the first material overlying the layer of the second material. In additional exemplary methods, the doped nitride adhesion film can comprise a mixture of the first material and the second material. In accordance with examples of these embodiments, a dopant ratio of the dopant to the metal in the doped nitride adhesion film is between 1:2 and 2:1, for example it can be 1:1. In accordance with yet further examples of these embodiments, the step of depositing the metal overlying the doped nitride adhesion film can comprise depositing the metal at a deposition temperature greater than 600° Celsius.

In accordance with additional embodiments of the disclosure, a structure is provided. Exemplary structures include a substrate comprising a plurality of gaps, a doped nitride adhesion film comprising, for example, a first material and a second material overlying the substrate, a nucleation layer overlying the doped nitride adhesion film, and a metal comprising a transition metal, such as at least one of molybdenum and ruthenium overlying the nucleation layer. The first material can be represented by $M_nX_m$ where M is the metal, X is a dopant, n ranges from 1 to 5, and m ranges from 1 to 10. The second material can be or include one or more of titanium nitride, molybdenum, molybdenum silicide and titanium silicide. In accordance with additional embodiments of the disclosure, the doped nitride adhesion film can comprise a layer of second material overlying the substrate and a layer of first material overlying the layer of second material. In accordance with further embodiments, the doped nitride adhesion film can comprise a layer of first material overlying the substrate, a layer of second material overlying the layer of first material, and a second layer of the first material overlying the layer of second material.

In accordance with additional embodiments of the disclosure, a reactor system is provided. An exemplary reactor system includes a reaction chamber configured to deposit a metal on a substrate and a controller. In accordance with various embodiments, the controller can be configured to cause the system to: deposit a doped (e.g., nitride) adhesion film on the surface of the substrate, deposit a nucleation layer overlying the doped nitride adhesion film, and deposit the metal overlying the nucleation layer. In accordance with various embodiments, the metal can comprise a transition metal, such as at least one of molybdenum and ruthenium. In accordance with various embodiments, the doped nitride adhesion film can comprise a first material and a second material. In accordance with examples of embodiments, the first material and the second material can be as described above.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIGS. 2-5 illustrate structures during a gap filling process in accordance with exemplary embodiments of the disclosure.

Figure 1:
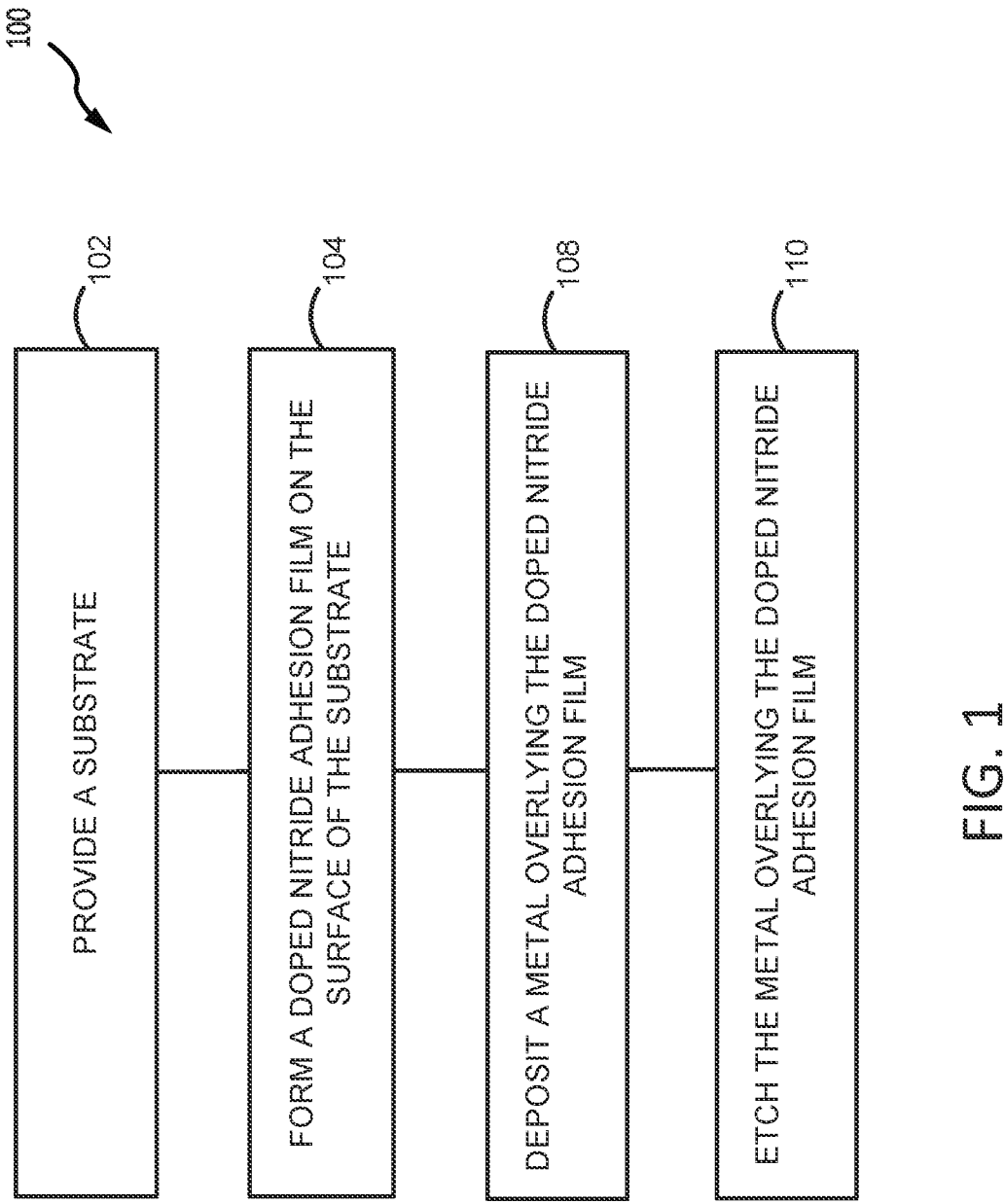
FIG. 1 illustrates a method of forming a structure in accordance with exemplary embodiments of the disclosure.

It will be appreciated that elements in the figures are illustrated for simplicity and clarity and have not necessarily been drawn to scale. For example, the dimensions of some of the elements in the figures can be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods and systems for forming a structure. By way of examples, a method can include at least partially filling gaps of a substrate by depositing and forming layers on the substrate. The layers can include a doped adhesion film, such as a doped nitride adhesion film, and a metal, such as a transition metal. The method can also include forming a nucleation layer overlying the doped nitride adhesion film.

As set forth in more detail below, an exemplary method can include forming the doped nitride adhesion film by depositing a layer of a first material overlying a substrate, depositing a layer of a second material overlying the layer of the first material, and depositing a second layer of the first material overlying the layer of the second material. Another exemplary method can include forming the doped nitride adhesion film by depositing a layer of the second material overlying the substrate and depositing a layer of the first material overlying the layer of the second material.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. The substrate (e.g., an insulating or dielectric material thereof) can include a surface that includes a plurality of gaps.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate and/or may be or may become embedded in a substrate. A film or layer may comprise material or a layer with pinholes and/or isolated islands. A film or layer may be at least partially continuous. In some cases, a film can include two or more layers.

As used herein, a "structure" can be or can include a substrate as described herein. Structures can include one or more layers overlying the substrate, such as one or more layers formed according to a method as described herein.

The term "deposition process" as used herein can refer to the introduction of precursors (and/or reactants) into a reaction chamber to deposit or form a layer over a substrate. "Cyclical deposition processes" are examples of "deposition processes."

As used herein, the term cyclic deposition can refer to the sequential introduction of one or more precursors and/or reactants into a reaction chamber to deposit a film over a substrate and includes deposition techniques such as atomic layer deposition and cyclical chemical vapor deposition. In some cases, a cyclic deposition process can include continuously providing a reactant and/or an inter gas to a reaction chamber and a pulsing a precursor to the reaction chamber.

As used herein, the term cyclical chemical vapor deposition can refer to any process wherein a substrate is sequentially exposed to one or more volatile precursors and/or reactants, which react and/or decompose on a substrate to produce a desired deposition.

As used herein, the term atomic layer deposition (ALD) may refer to a vapor deposition process in which deposition cycles, preferably a plurality of consecutive deposition cycles, are conducted in a reaction chamber. Typically, during each cycle, the precursor is chemisorbed to a deposition surface (e.g., a substrate surface or a previously deposited underlying surface, such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. The term atomic layer deposition, as used herein, is meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

In some cases, the term precursor can refer to a compound that participates in the chemical reaction that produces another compound, and particularly to a compound that constitutes a film matrix or a main skeleton of a film; the term reactant can be used to refer to a gas that reacts with the precursor or derivative thereof to form a desired material. In some cases, the term reactant can be used interchangeably with the term precursor.

In this disclosure, any two numbers of a variable can constitute a workable range of the variable, and any ranges indicated can include or exclude the endpoints. Additionally, any values of variables indicated (regardless of whether they are indicated with "about" or not) can refer to precise values or approximate values and include equivalents, and can refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Turning now to the figures, FIG. 1 illustrates an exemplary method 100 for forming a structure according to an embodiment of the present disclosure. FIGS. 2-5 illustrate structures formed at stages of method 100. Method 100 can begin with step 102, which can involve providing a substrate (such as substrate 200, illustrated in FIG. 2) within a first reaction chamber.

The substrate 200 can comprise a plurality of gaps (such as gaps 203). The substrate 200 comprises a surface 202. As further illustrated, the substrate 200 can include a bulk material 204, such as silicon, and a liner 206, such as silicon oxide or the like.

During step 102, the first reaction chamber can be brought to a desired temperature for subsequent processing. For example, the reaction chamber or a susceptor therein can be at a temperature greater than 600° Celsius or between about 200° C. and about 600° C.

With reference again to FIG. 1 and to FIG. 3, method 100 includes a step 104, which can involve forming a doped nitride adhesion film (such as doped nitride adhesion film 304, illustrated in FIG. 3) on the surface of the substrate 202 to form a structure (such as structure 300). During step 104, the doped nitride adhesion film 304 is deposited on surface 202 of the substrate 200, including within the plurality of gaps 203.

The doped nitride adhesion film 304 can comprise a first material and a second material. The first material can be represented by $M_nX_m$ where M is a metal, X is a dopant, n ranges from 1 to 5, and m ranges from 1 to 10. The metal can comprise at least one of molybdenum, ruthenium. The dopant can comprise one or more of titanium, tungsten, silicon, boron, nitrogen, carbon, tantalum, and manganese. The first material can comprise a dopant ratio of the dopant to the metal in the doped nitride adhesion film, the dopant ratio can be between about 1:2 and about 2:1, for example it can be 1:1. The second material can comprise one or more of titanium nitride, molybdenum, molybdenum silicide and titanium silicide.

Figure 17:
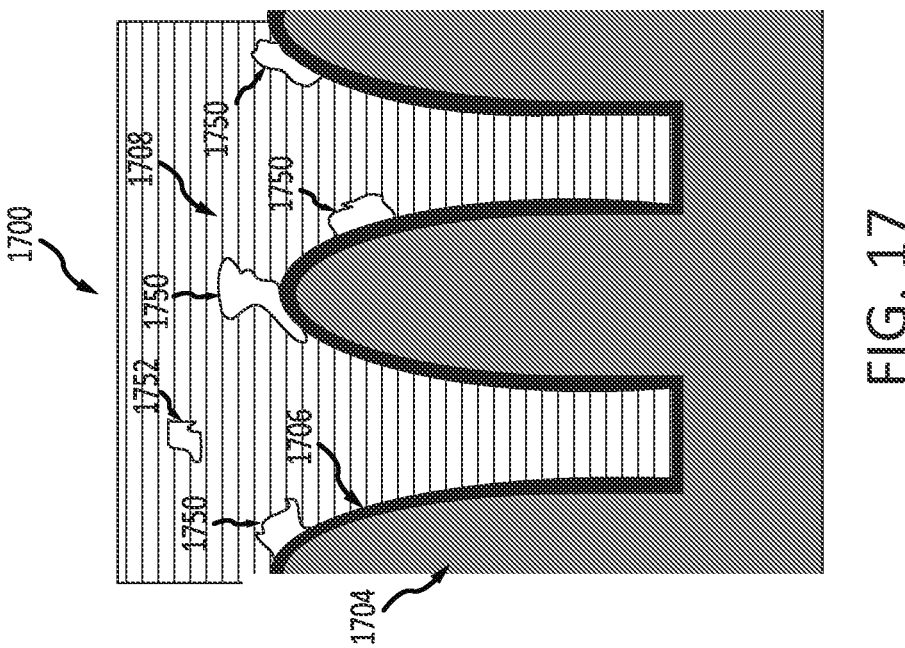
FIG. 17 illustrates a cross sectional view of a structure in accordance with exemplary embodiments of the disclosure.

With additional reference to FIG. 17, a substrate 1700 comprises a plurality of gaps (such as gaps 1703). As further illustrated, the substrate 1700 can include a bulk material 1704, such as silicon, and a liner 1706, such as silicon oxide or the like. A metal 1708 can be deposited using for example, a cyclical deposition process onto the liner 1706. During the deposition process pull-ups/delamination 1750 can occur on the liner 1706 and macro-voids 1752 can form in the metal 1708. The pull-ups/delamination 1750 and macro-voids 1752 can be avoided based on process parameters. For example, the dopant ratio can be tuned to reduce agglomeration and pull-ups/delamination.

The first material and/or the second material can be deposited using a cyclical deposition process. Exemplary precursors for deposition of the first material include titanium, a molybdenum chalcogenide, a molybdenum oxyhalide, such as $MoO_2Cl_2$ or $MoCl_5$, chlorine, and oxygen and exemplary reactants for deposition of the first material include a hydrogen, silicon, nitrogen, or carbon containing compound. Deposition of the first material and/or the second material during step 104 can occur at a deposition temperature greater than 600° Celsius or between about 200° C. and about 600° C.

A total thickness of the doped nitride adhesion film 304 can also be tuned to reduce agglomeration and pull-ups. In accordance with examples of embodiments, the doped nitride adhesion film 304 can be formed to a first thickness. The first thickness can be between 3 angstroms and 50 angstroms, between 15 angstroms and 50 angstroms, or between 3 angstroms and 10 angstroms. In some cases, the doped nitride adhesion film 304 can comprise a mixture of the first material and the second material, such that the first material and the second material do not form distinct layers.

Figures 4, 5:
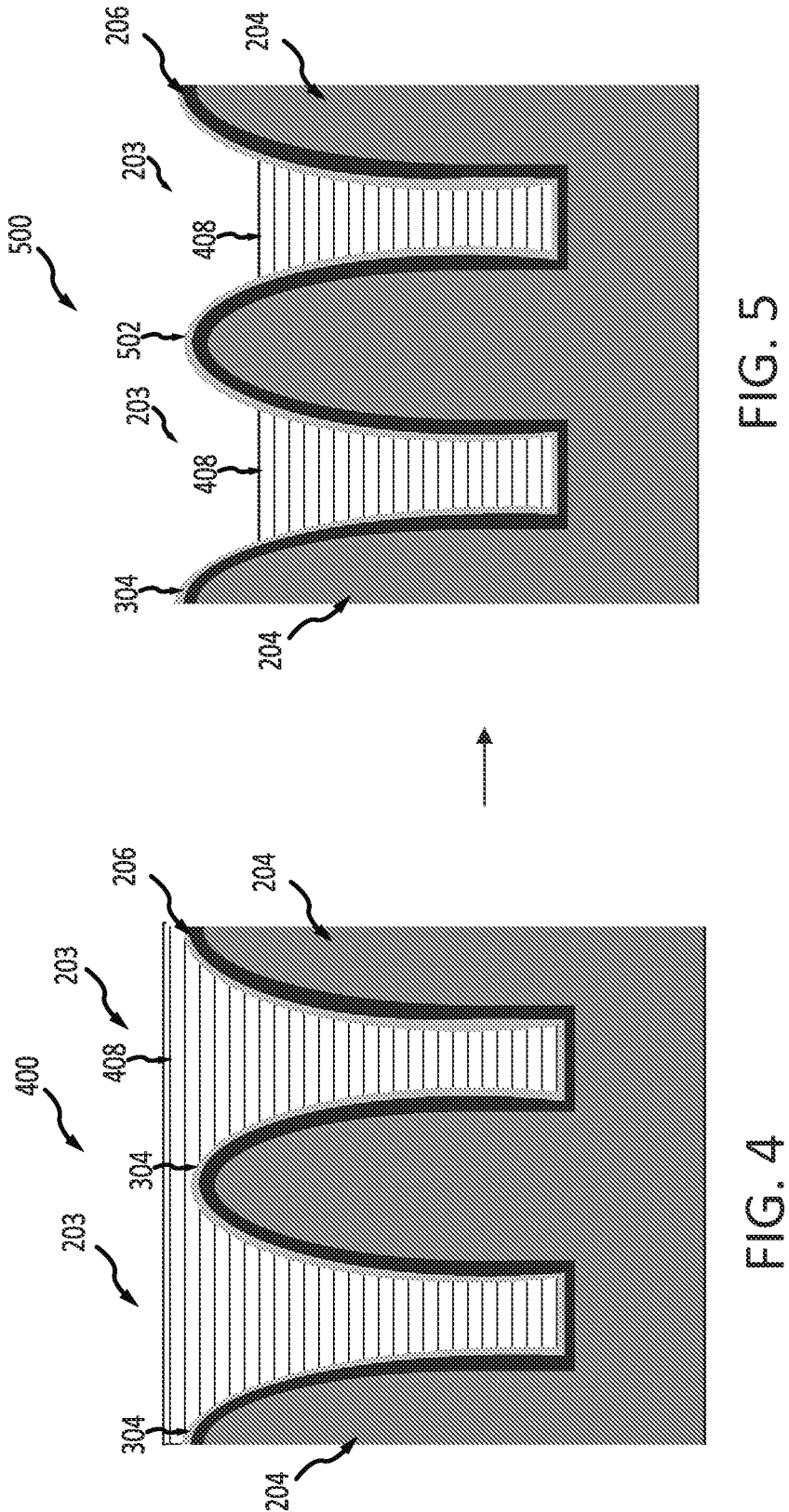

With reference to FIG. 1 and FIG. 4, method 100 includes a step 108, which can involve depositing a metal (such as metal 408, illustrated in FIG. 4) overlying the doped nitride adhesion film 304 to form a structure (such as structure 400). The metal 408 can comprise at least one of molybdenum and ruthenium.

In accordance with further examples of embodiments, the metal 408 can be deposited using for example, a cyclical deposition process. Exemplary precursors suitable for depositing the metal 408 include a molybdenum chalco-genide, a molybdenum oxyhalide, such as $MoO_2Cl_2$, chlorine, and oxygen and exemplary reactants for depositing the metal 408 include a hydrogen, silicon, nitrogen, or carbon containing compound. The temperatures and precursors within the reaction can be as described above in connection with step 102.

With reference again to FIG. 1 and to FIG. 5, additional embodiments of method 100 can include an etching step 110 after step 108. Etching step 110 can include etching back the metal 408 below the top 502 of the gaps 203 to form a structure (such as structure 500, illustrated in FIG. 5). The metal 408 can be etched back using, for example, reactive ion etching (ME), capacitively coupled plasma etching (CCP), electron cyclotron resonance etching (ECR), or the like. Exemplary etchants include nitrogen trifluoride plasma, sulfur hexafluoride, molybdenum pentachloride, tungsten pentachloride.

Figure 6:
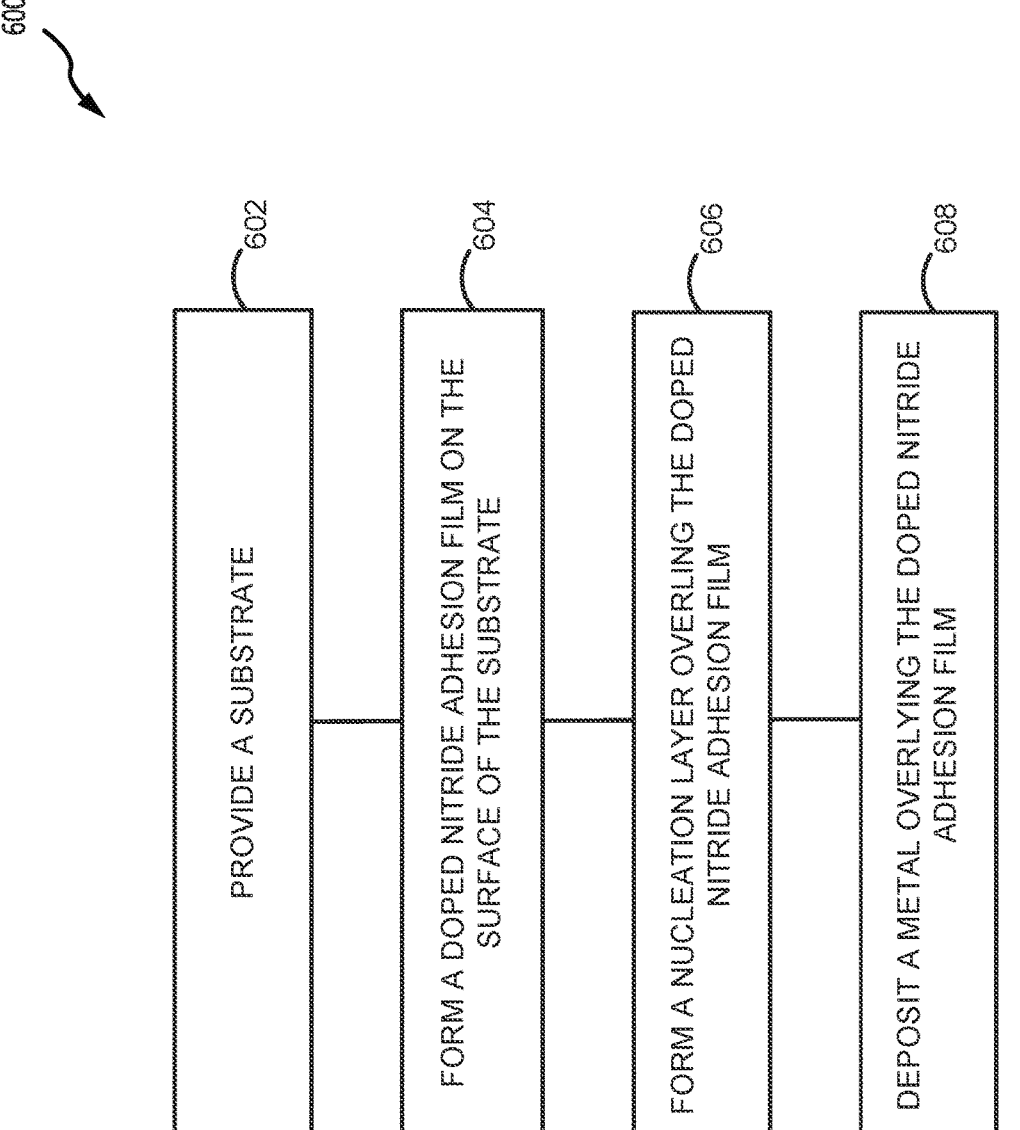
FIG. 6 illustrates a method of forming a structure in accordance with exemplary embodiments of the disclosure.
Figures 7, 8:
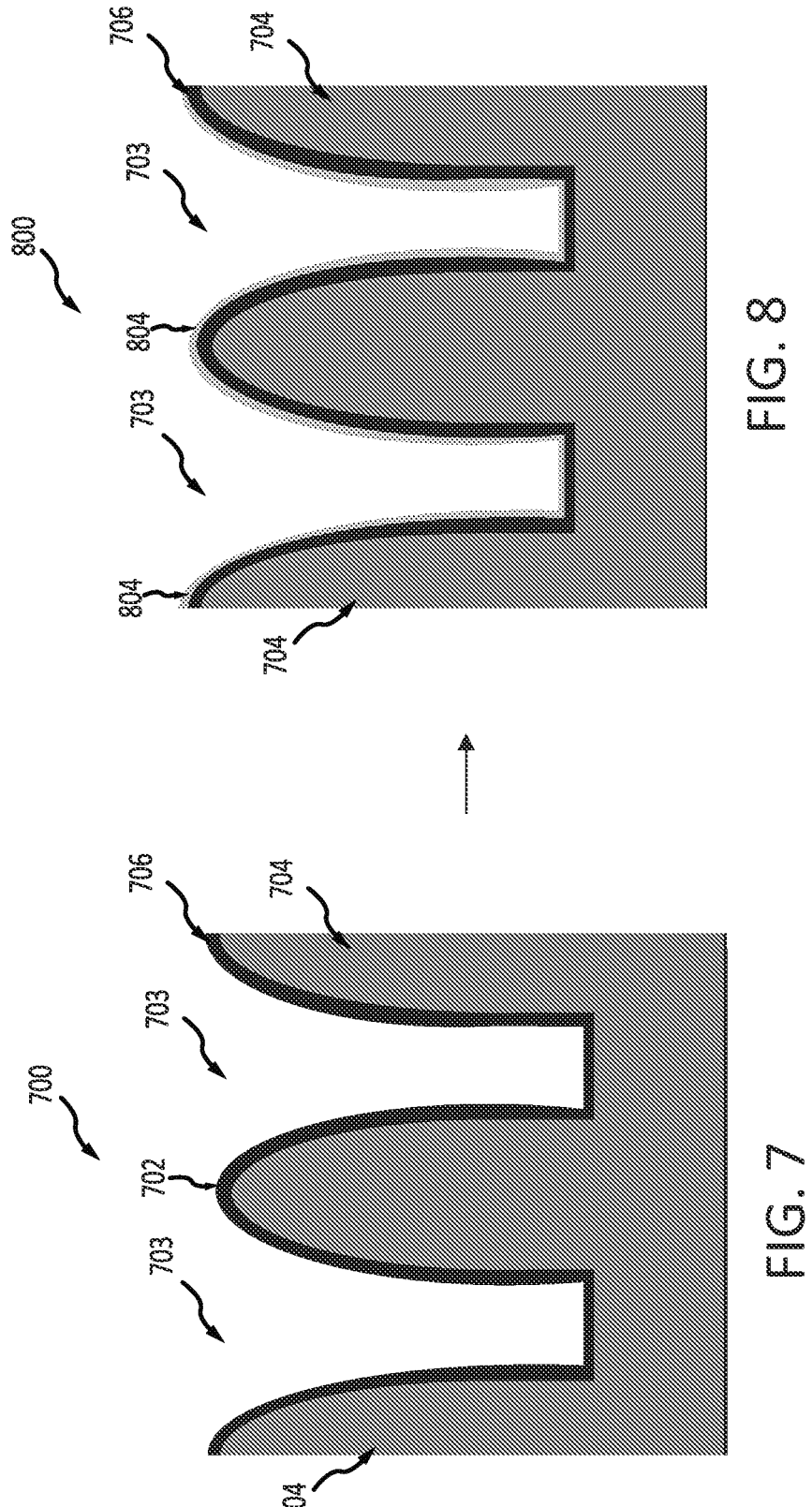
FIGS. 7-10 illustrate additional structures during a gap filling process in accordance with additional exemplary embodiments of the disclosure.

FIG. 6 illustrates another exemplary method 600 for forming a structure according to an embodiment of the present disclosure. FIGS. 7-10 illustrate structures formed at stages of method 600. The method 600 can begin with step 602, which can involve providing a substrate (such as substrate 700, illustrated in FIG. 7) within a first reaction chamber.

The substrate 700 can comprise a plurality of gaps (such as gaps 703). Substrate 700 comprises a surface 702. As further illustrated, the substrate 700 can include a bulk material 704, such as silicon, and a liner 706, such as silicon oxide or the like.

During step 602, the first reaction chamber can be brought to a desired temperature for subsequent processing. In this context, step 602 can be the same or similar to step 102 described above.

With reference again to FIG. 6 and FIG. 8, method 600 includes a step 604, which can involve forming a doped nitride adhesion film (such as doped nitride adhesion film 804, illustrated in FIG. 8) on the surface 702 of substrate 700 to form a structure (such as structure 800).

During step 604, the doped nitride adhesion film 804 is deposited on surface 702, including within the plurality of gaps 703. The doped nitride adhesion film 804 can comprise a first material and a second material, as described above.

The first material and second material can be deposited using the same or similar precursors, reactants, and/or process conditions described above in connection with step 104. In accordance with examples of embodiments, the doped nitride adhesion film 804 can be formed to a first thickness. The first thickness can be between 3 angstroms and 50 angstroms, between 15 angstroms and 50 angstroms, or between 3 angstroms and 10 angstroms.

Figures 9, 10:
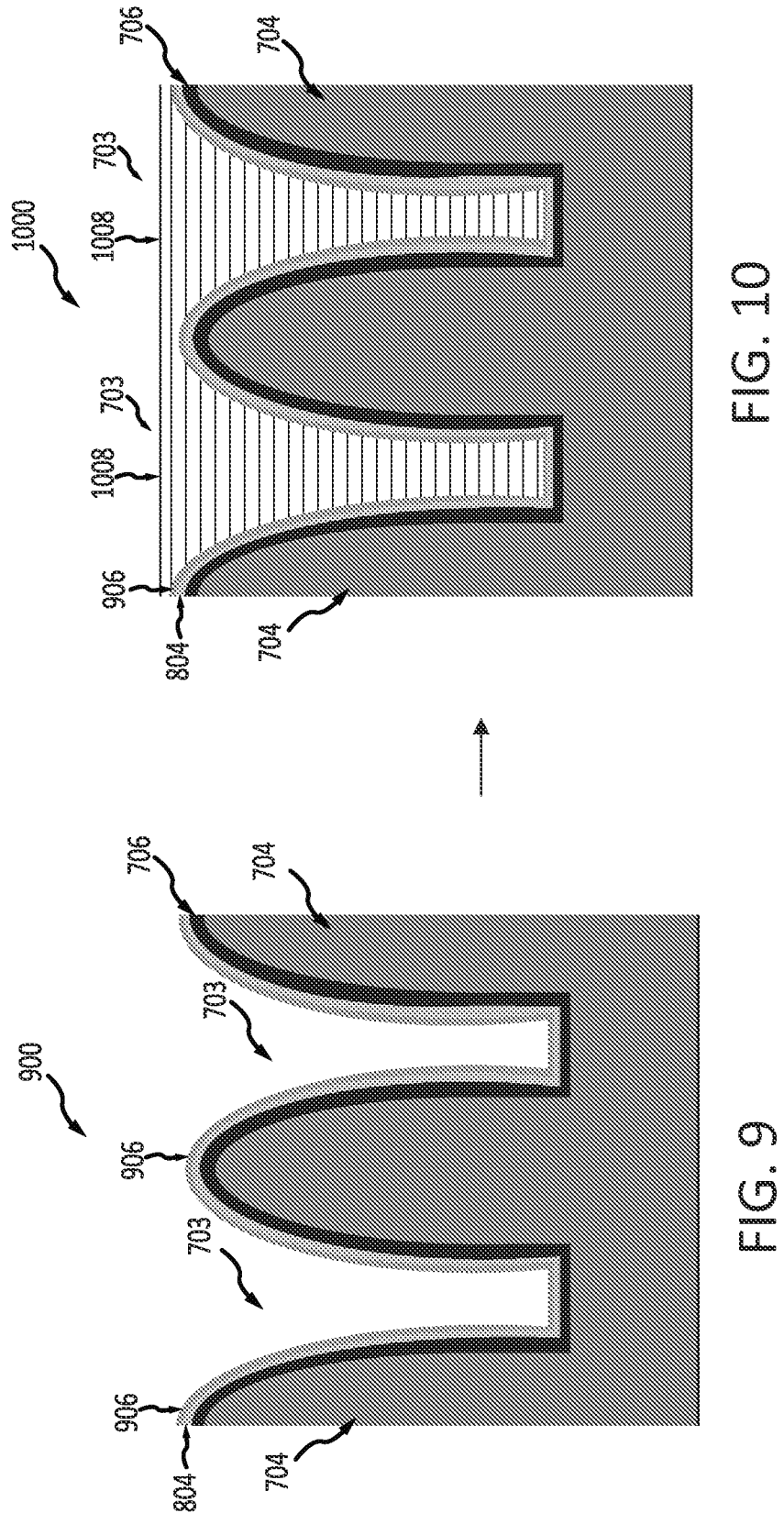

With reference to FIG. 6 and FIG. 9, method 600 includes a step 606 of forming a nucleation layer (such as nucleation layer 906, illustrated in FIG. 9) overlying the doped nitride adhesion film 804 to form a structure (such as structure 900). In accordance with examples of embodiments, the nucleation layer 906 can comprise at least one of the metal and a nitride. The metal can comprise at least one of molybdenum and ruthenium. Nucleation layer 906 can be formed using a cyclical deposition process. Exemplary precursors for depositing nucleation layer 906 include titanium, a molybdenum chalcogenide, a molybdenum oxyhalide, such as $MoO_2Cl_2$ or $MoCl_5$, chlorine, and oxygen. Exemplary reactants suitable for step 606 include hydrogen, silicon, nitrogen, or carbon containing compound.

In accordance with examples of embodiments, the nucleation layer 906 can be formed to a second thickness. The second thickness can be between 1 angstrom and 10 angstroms. In some cases, the first thickness can be greater than the second thickness.

With reference to FIG. 6 and FIG. 10, method 600 includes a step 608 of depositing a metal (such as metal 1008, illustrated in FIG. 10) overlying the nucleation layer 906 to form a structure (such as structure 900).

The metal 908 can comprise at least one of molybdenum and ruthenium. The metal 908 can be deposited using the same or similar precursors, reactants, and/or process conditions described above in connection with step 108. In some cases, the metal 908 can be etched back using for example, a process as described above in connection with etching step 110.

Figure 11:
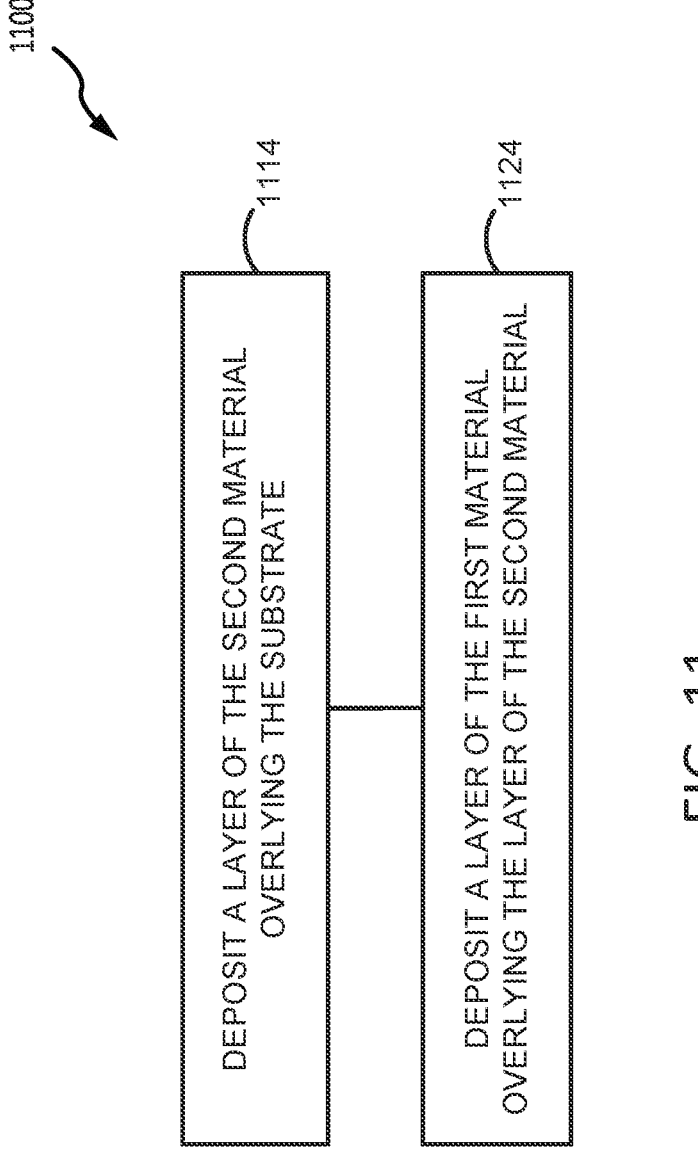
FIG. 11 illustrates a method of forming a nitride adhesion film in accordance with exemplary embodiments of the disclosure.

With reference to FIG. 11, a process 1100 for performing the steps 104 or 604 is illustrated. Process 1100 can comprise forming the doped nitride adhesion films 304 or 804 by depositing a layer of the second material overlying the substrate 200 and 700 (step 1114). A thickness of the second material can be between about 1 angstrom and about 10 angstroms. Process 1100 can further comprise depositing a layer of the first material overlying the layer of the second material (step 1124). A thickness of the first material can be between about 3 nm and about 50 nm.

Figure 12:
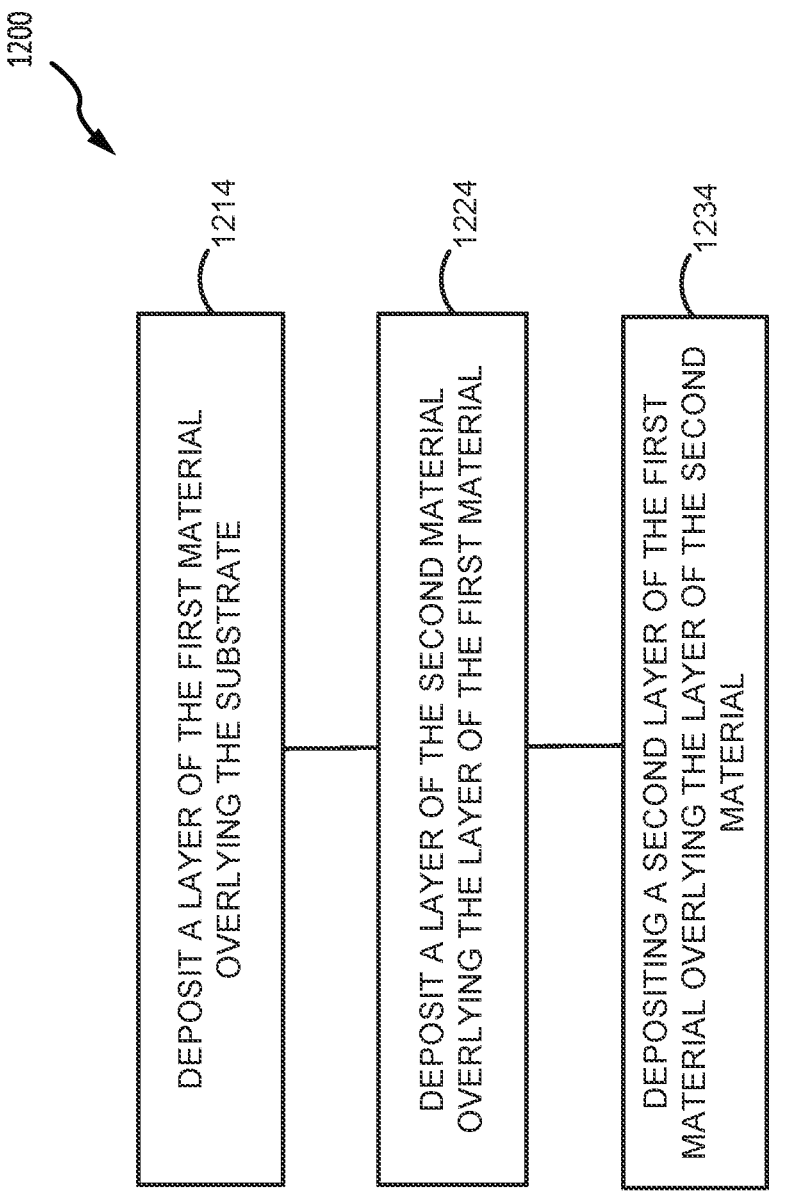
FIG. 12 illustrates a method of forming a nitride adhesion film in accordance with additional exemplary embodiments of the disclosure.

With reference to FIG. 12, the steps 104 and 604 may comprise process 1200 when forming the doped nitride adhesion films 304 and 804. Process 1200 can comprise forming the doped nitride adhesion films 304 and 804 by depositing a layer of the first material overlying the substrates 200 and 700 (step 1214). The method 1200 can also comprise depositing a layer of the second material overlying the layer of the first material (step 1224). Method 1200 may further comprise depositing a second layer of the first material overlying the layer of the second material (step 1234). The doped nitride adhesion films 304 and 804 can comprise a mixture of the first material and the second material. A mixture of the first material can be a homogenous mixture of the first material and the second material such that there are no distinct layers of first material and second material. A thickness of the first and/or the second material layer can be as described above.

Figure 13:
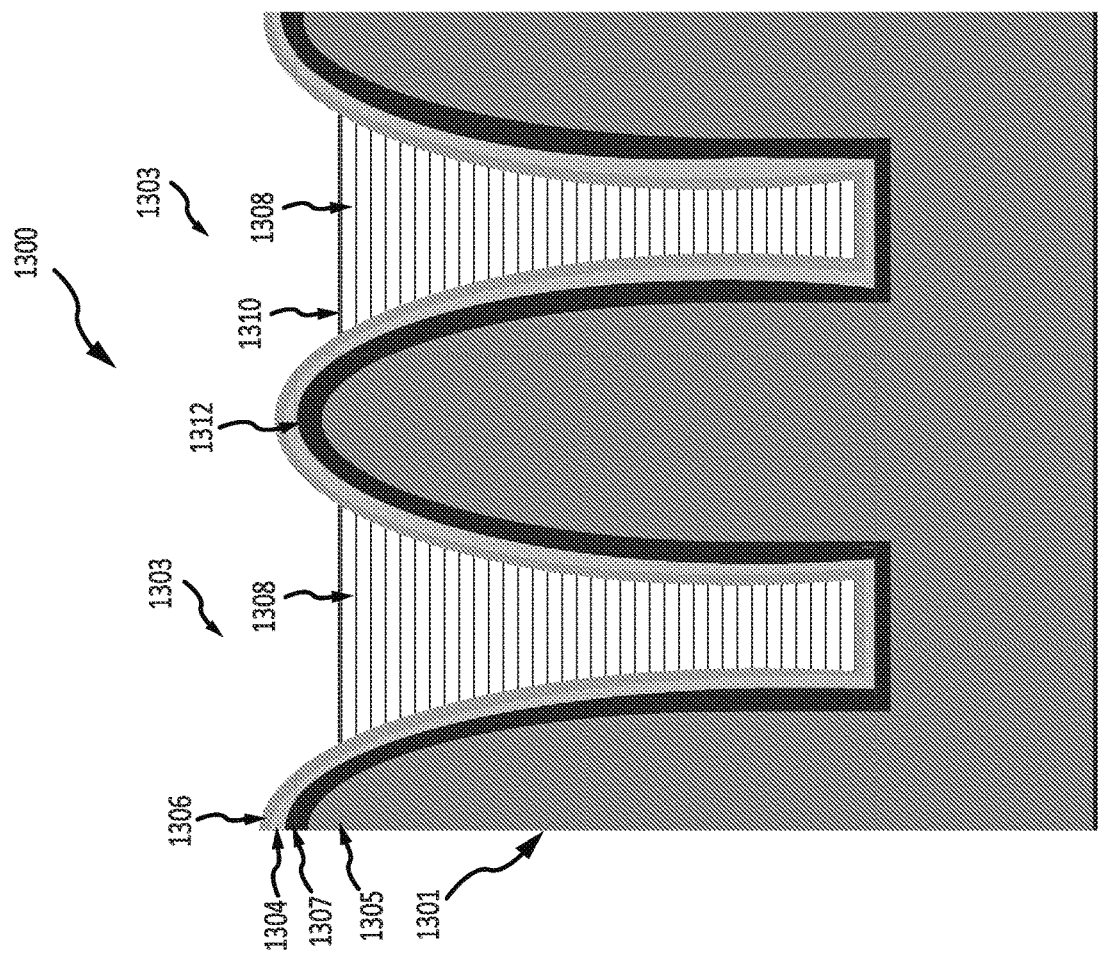
FIG. 13 illustrates a cross sectional view of a structure in accordance with exemplary embodiments of the disclosure.

FIG. 13 illustrates a structure 1300 in accordance with different embodiments of the disclosure. Structure 1300 can be formed by method 600 as described above. The structure 1300 can comprise a substrate 1301 with a plurality of gaps 1303. The substrate 1301 can include a bulk material 1305, such as silicon, and a liner 1307, such as silicon oxide or the like. The structure 1300 can also comprise a doped nitride adhesion film 1304 overlying the substrate 1301. Doped nitride adhesion film 1304 can comprise a first material and a second material, as described above. A nucleation layer 1306 can overlay the doped nitride adhesion film 1304 and a metal 1308 can overlay the nucleation layer 1306. The nucleation layer 1306 can comprise at least one of titanium, tungsten, silicon, boron, nitrogen, carbon, tantalum, and manganese. The metal 1308 can comprise at least one of molybdenum and ruthenium. As illustrated, the metal layer 1308 can be etched back, such that a surface 1310 of the metal layer is below a top surface 1312 of substrate 1301.

Figure 14:
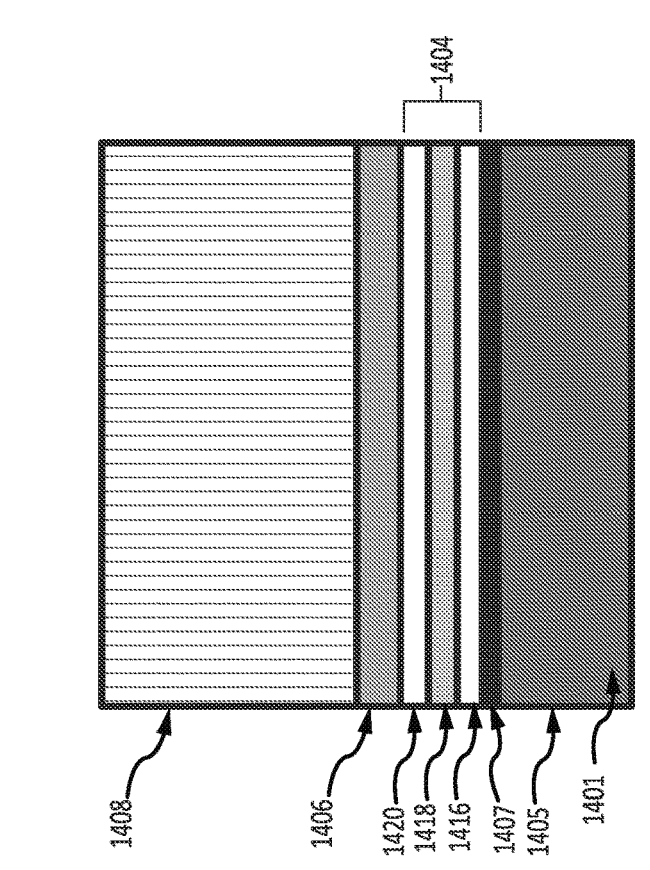

FIG. 14 illustrates exemplary structure 1400. In certain embodiments, structure 1400 can be or form a portion of structure 1300. The structure 1400 can be formed by method 600 and process 1200 as described above. The structure 1400 can comprise a substrate 1401 with a plurality of gaps (not illustrated in FIG. 14 but illustrated elsewhere). The substrate 1401 can include a bulk material 1405, such as silicon, and a liner 1407, such as silicon oxide or the like. The structure 1400 can also comprise a doped nitride adhesion film 1404 overlying the substrate 1401. The structure 1400 can further comprise a nucleation layer 1406 overlying the doped nitride adhesion film 1404. The nucleation layer 1406 can be formed using the step 606 described above. The doped nitride adhesion film 1404 can comprise a first material and a second material. A metal 1408 can overlay the nucleation layer 1406. The metal 1408 can comprise at least one of molybdenum and ruthenium.

The doped nitride adhesion film 1404 can comprise a layer of first material 1416 overlying the substrate 1401 and liner 1407. The doped nitride adhesion film 1404 can comprise a layer of second material 1418 overlying the layer of first material 1416. The doped nitride adhesion film 1404 can comprise a second layer of the first material 1420 overlying the layer of second material 1418. In some cases, the layers of material, 1416, 1418, and 1420 can form a mixture such that there are not distinct layers of first material and second material.

Figure 15:
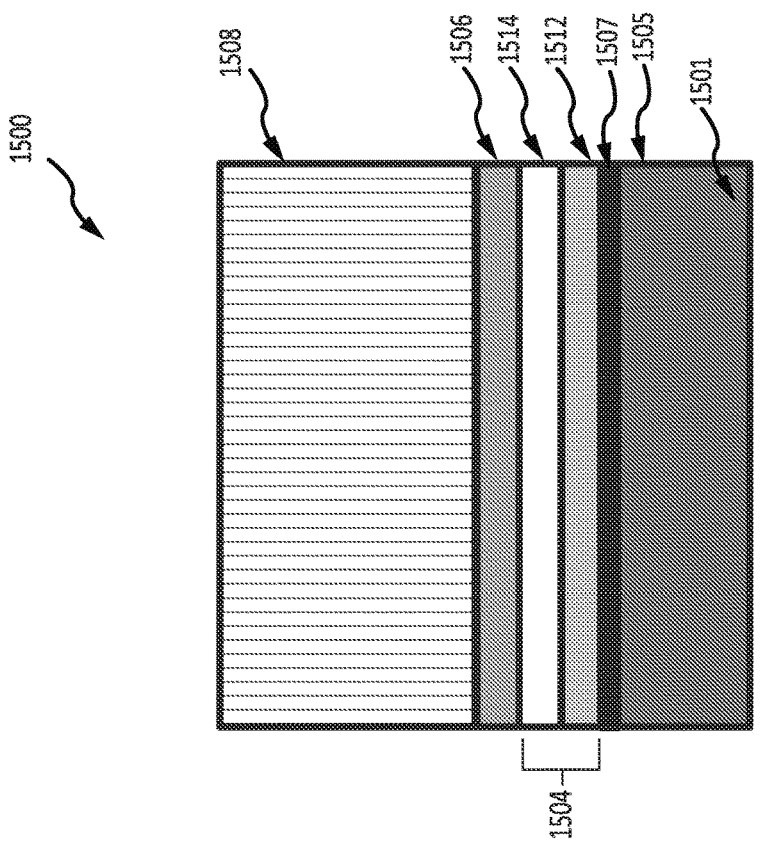
FIGS. 14-15 illustrate a cross sectional views of additional structures in accordance with exemplary embodiments of the disclosure.

FIG. 15 illustrates another exemplary structure 1500, illustrating detail of material layers. In certain embodiments, structure 1500 can be a portion of structure 1300. The structure 1500 can be formed by method 600 or 1100 as described above. The structure 1500 can comprise a substrate 1501 with a plurality of gaps (not illustrated in FIG. 15 but illustrated elsewhere). The substrate 1501 can include a bulk material 1505, such as silicon, and a liner 1507, such as silicon oxide or the like. The structure 1500 can also comprise a doped nitride adhesion film 1504 overlying the substrate 1501 and the liner 1507. The structure 1500 can further comprise a nucleation layer 1506 overlying the doped nitride adhesion film 1504. The nucleation layer 1506 can be formed using the step 606 described above. The doped nitride adhesion film 1504 can comprise a first material and a second material. A metal 1508 can overlay the nucleation layer 1406. The metal can comprise at least one of molybdenum and ruthenium.

The doped nitride adhesion film 1504 can comprise a layer of second material 1512 overlying the substrate 1501 and the liner 1507. The doped nitride adhesion film 1504 can comprise a layer of first material 1514 overlying the layer of second material 1512. In some cases, the layers of material, 1512 and 1514 can form a mixture such that there are not distinct layers of first material and second material.

Figure 18:
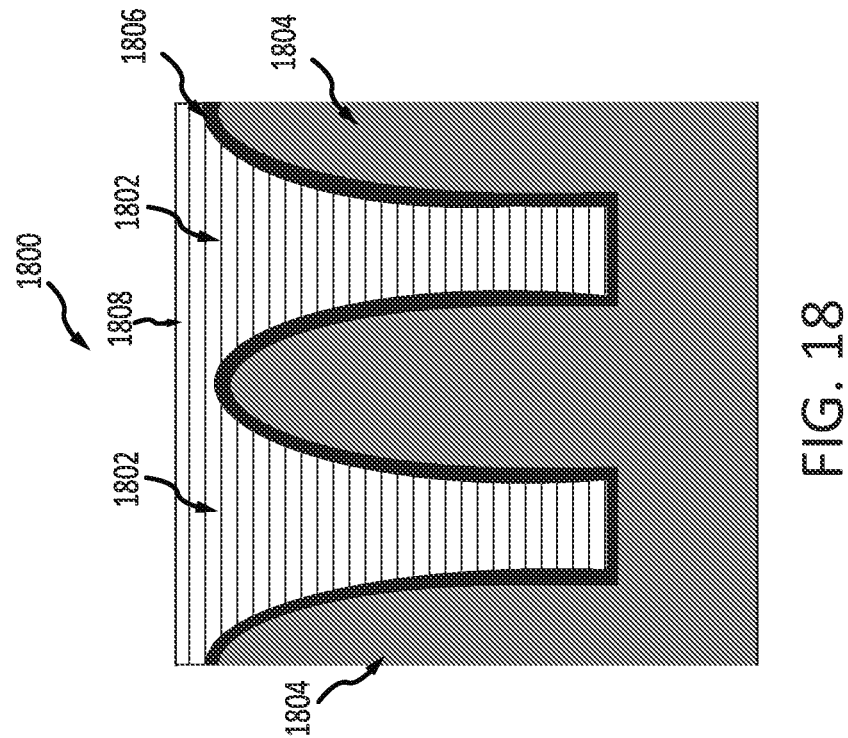
FIG. 18 illustrates a cross sectional view of a structure in accordance with exemplary embodiments of the disclosure.

FIG. 18 illustrates yet another exemplary structure 1800 in accordance with examples of the disclosure. Structure 1800 comprises a plurality of gaps (such as gaps 1802). As further illustrated, structure 1800 can include a bulk material

1804, such as silicon (e.g., single-crystal silicon), other Group IV materials, such as germanium, or other semiconductor materials, such as Group II-VI or Group III-V semiconductor materials. An adhesion film 1806 can be deposited on the bulk material using any method as disclosed herein. Adhesion film 1806 comprises a doped metal. Exemplary metal include titanium, tungsten, titanium nitride, and the like. Exemplary dopants include boron, silicon, and the like. The adhesion film (e.g., a metal boride or the like) can be deposited as a monolayer or bi-layer. A metal 1808 can be deposited using for example, a cyclical deposition process onto the adhesion film 1806. In various embodiments, the metal comprises a transition metal, and the metal and the adhesion film comprise the same metal.

Structure 1800 may be particularly suitable for DRAM buried word line (bWL) applications. In such cases, metal layers generally require a certain range of electron work function (eWF). Certain dopants (e.g., boron) can provide eWF turnability to the metal layers that can be scaled according to the doping level. The resulting structure formed in FIG. 18 can be a buried word line structure formed using any of the methods disclosed herein.

Figure 16:
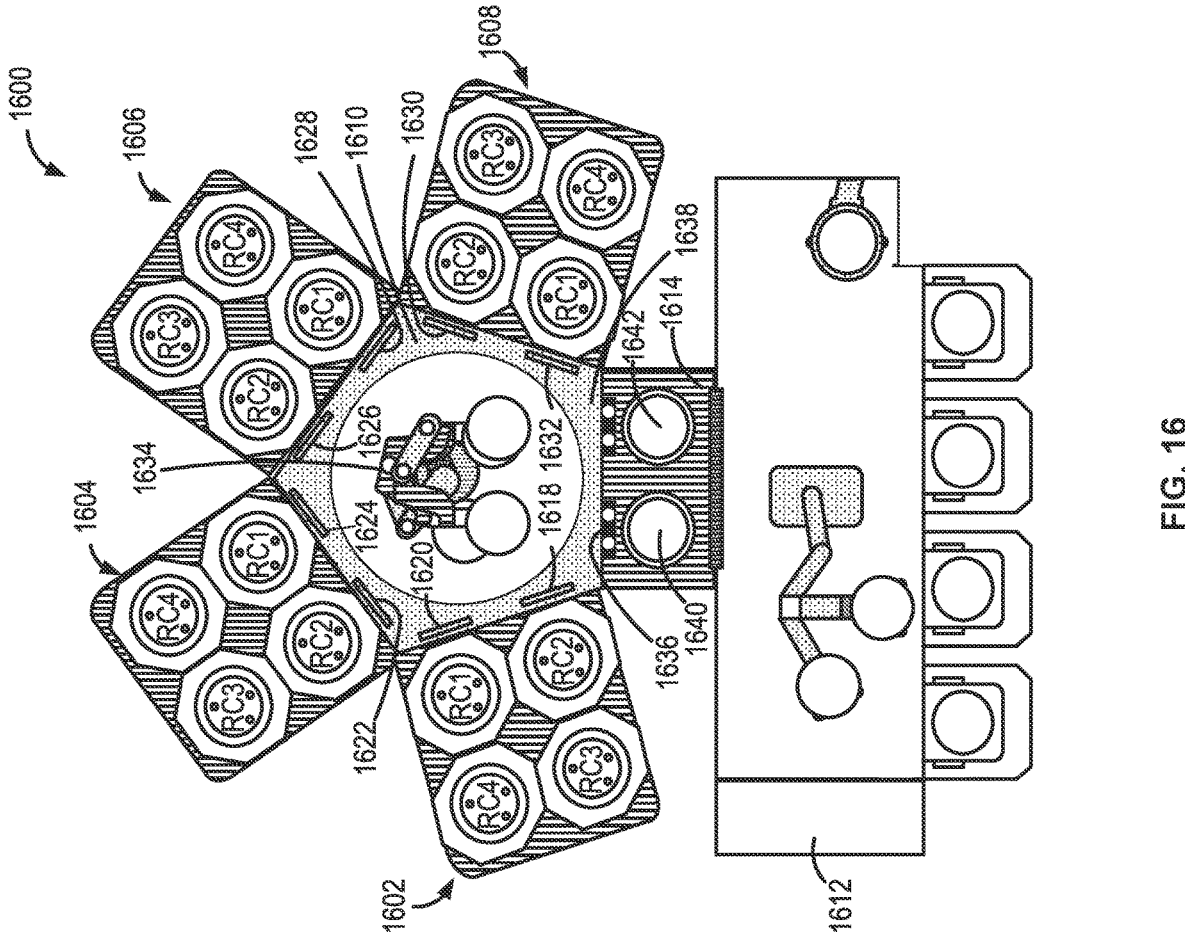
FIG. 16 illustrates a reactor system in accordance with exemplary embodiments of the disclosure.

FIG. 16 illustrates an exemplary reactor system 1600 in accordance with examples of the disclosure. Reactor system 1600 can include a plurality of process modules 1602-1608, a substrate handling chamber 1610, a controller 1612, and a load lock chamber 1614. Reactor system 1600 can be used to perform methods 100 or 600 and/or processes 1100 or 1200. Reactor system 1600 can be configured to deposit a doped nitride adhesion film such as doped nitride adhesion films 304, 804, 1304, 1404 and 1504 on the surface of a substrate such as substrates 200, 700, 1301, 1401 and 1501. In exemplary embodiments, reactor system 1600 can be configured to deposit a nucleation layer such as nucleation layers 906, 1306, 1406 and 1506 overlying the doped nitride adhesion films 304, 804, 1304, 1404 and 1504. Further, reactor system 1600 can be configured to deposit a metal such as metals 408, 1008, 1308, 1408 and 1508 overlying the nucleation layers 906, 1306, 1406 and 1506. The various layers can be deposited in one or more reaction chambers RC1-RC4 of a process module 1602-1608 or within reaction chambers of different modules.

In the illustrated example, each process module 1602-1608 includes four reaction chambers RC1-RC4, each of which can form a reactor within the module. Unless otherwise noted, RC1-RC4 can be in any suitable order. Further, process modules in accordance with examples of the disclosure can include any suitable number of reaction chambers. Various process modules within a reaction system can be configured the same or differently.

In accordance with examples of the disclosure, at least one process module 1602-1608 comprises a first reaction chamber RC1, a second reaction chamber RC2, a third reaction chamber RC3, and optionally a fourth reaction chamber RC4. In accordance with further examples, two or more (e.g., 2, 3, or 4) of process modules 1602-1608 include a first reaction chamber RC1, a second reaction chamber RC2, a third reaction chamber RC3, and optionally a fourth reaction chamber RC4.

First reaction chamber RC1, second reaction chamber RC2, and third reaction chamber RC3 can thus be used to deposit the material on the substrate. In some cases, two or more (e.g., 2, 3, or 4) process modules are similarly configured. Alternatively, two or more (e.g., all) reaction chambers within a process module can perform the same reaction. By way of examples, first reaction chamber RC1 can be configured to deposit a first material as described herein, second reaction chamber RC2 can be configured to deposit a second material as described herein, third reaction chamber RC3 can be used to form a nucleation layer as described herein, and a fourth reaction chamber RC4 can be configured to deposit a metal as described herein.

Substrate handling chamber 1610 couples to each process module 1602-1608. By way of example, substrate handling chamber 1610 can couple to each process module 1602 and 1608 via gate valves 1618 and 1632. In accordance with examples of the disclosure, process module 1602 and 1608 can be coupled to and decoupled from substrate handling chamber 1610.

Substrate handling chamber 1610 can be used to move substrates between load lock chamber 1614 and one or more process modules 1602-1608 and/or between process modules 1602-1608. Substrate handling chamber 1610 can include a back-end robot 1634. Back-end robot 1634 can transport substrates from load lock chamber 1614 (e.g., stages 1640, 1642 therein) and any one of any susceptors within any of the reaction chambers. Back-end robot 1634 can be or include, for example, a multi joint robot. By way of example, back-end robot 1634 can retrieve and move a substrate to be transported using electrostatic or vacuum force. Back-end robot 1634 can be, for example, an end effector.

Controller 1612 can be configured to perform one or more steps or functions of methods 100, 600, and/or processes 1100, 1200 described herein. Controller 1612 includes electronic circuitry and software to selectively operate valves, manifolds, heaters, pumps, and other components included in reactor system 1600. Such circuitry and components operate to provide gasses, regulate temperature, and the like to provide proper operation of reactor system 1600. Controller 1612 can include modules, such as software and/or hardware components, which perform certain tasks. A module may be configured to reside on the addressable storage medium of the control system and be configured to execute one or more processes, such as a method described herein.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method of forming a structure, the method comprising the steps of:
   providing a substrate comprising a plurality of gaps within a first reaction chamber,
   forming a doped nitride adhesion film on a surface of the substrate and within the plurality of gaps, wherein the doped nitride adhesion film comprises a first material and a second material, wherein forming the doped nitride adhesion film comprises depositing a layer of the first material by a cyclical deposition process and depositing a layer of the second material by a cyclical deposition process, wherein the first material is overlying the second material, wherein the first material is represented by $M_nX_m$ where M comprises at least one of molybdenum and ruthenium, X is a dopant comprising one or more of tungsten, boron, and tantalum, n ranges from 1 to 5, and m ranges from 1 to 10, and wherein the second material comprises titanium nitride; and
   depositing a metal overlying the doped nitride adhesion film, wherein the metal comprises at least one of molybdenum and ruthenium.

2. The method of claim 1, further comprising forming a nucleation layer comprising at least one of molybdenum and ruthenium overlying the doped nitride adhesion film.

3. The method of claim 1, wherein the dopant comprises boron.

4. The method of claim 3, wherein the step of forming the doped nitride adhesion film comprises forming the doped nitride adhesion film to a first thickness and wherein the step of forming the nucleation layer comprises forming the nucleation layer to a second thickness, wherein the first thickness is between 15 angstroms and 50 angstroms.

5. The method of claim 4, wherein the second thickness is between 1 angstrom and 10 angstroms.

6. The method of claim 3, wherein the doped nitride adhesion film comprises a mixture of the first material and the second material.

7. The method of claim 3, wherein the metal comprises ruthenium, and wherein the step of depositing the metal overlying the doped nitride adhesion film comprises depositing the metal at a deposition temperature greater than 600° Celsius.

8. The method of claim 1, wherein the dopant comprises tantalum.

9. The method of claim 1, wherein the dopant comprises tungsten.

10. The method of claim 9, wherein the step of forming the doped nitride adhesion film comprises:
   depositing a layer of the second material overlying the substrate, and
   depositing a layer of the first material overlying the layer of the second material.

11. The method of claim 9, wherein the step of forming the doped nitride adhesion film comprises:
   depositing a layer of the first material overlying the substrate,
   depositing a layer of the second material overlying the layer of the first material, and
   depositing a second layer of the first material overlying the layer of the second material.

12. The method of claim 1, wherein the second material further comprises one or more of molybdenum silicide and titanium silicide.

13. The method of claim 1, wherein the doped nitride adhesion film is formed on a layer of silicon oxide.

14. The method of claim 1, wherein the dopant consists of boron.

15. The method of claim 1, wherein the dopant consists of tantalum.

16. The method of claim 1, wherein the dopant consists of tungsten.

17. The method of claim 1, wherein a dopant ratio of the dopant to M in the doped nitride adhesion film is between 1:2 and 2:1.

18. The method of claim 1, wherein the doped nitride adhesion film comprises a homogenous mixture of the first material and the second material.

19. The method of claim 1, wherein the second material further comprises molybdenum silicide.

20. The method of claim 1, wherein the second material further comprises titanium silicide.

* * * * *